United States Patent [19]
Gollomp et al.

[11] Patent Number: 5,106,308
[45] Date of Patent: Apr. 21, 1992

[54] PLANAR CONTACT GRID ARRAY CONNECTOR

[75] Inventors: Bernard P. Gollomp, West Lawrence, N.Y.; Bruce E. Kurtz, Lebanon, N.J.

[73] Assignee: Allied-Signal Inc., Morris Township, Morris County, N.J.

[21] Appl. No.: 663,976

[22] Filed: Mar. 4, 1991

[51] Int. Cl.[5] ............................................. H01R 9/09
[52] U.S. Cl. ...................................... 439/67; 174/252
[58] Field of Search ................ 439/74, 85, 67, 85; 361/386, 387, 414; 174/252, 256; 29/830, 831, 846, 852

[56] References Cited

U.S. PATENT DOCUMENTS

| | | | |
|---|---|---|---|
| 3,932,932 | 1/1976 | Goodman | 29/852 |
| 4,046,442 | 9/1977 | Hutchison | 439/72 |
| 4,116,517 | 9/1978 | Selvin et al. | 439/329 |
| 4,544,989 | 10/1985 | Nakabu et al. | 361/386 |
| 4,791,239 | 12/1988 | Shirahata et al. | 361/414 |
| 4,866,571 | 9/1989 | Butt | 361/386 |
| 4,914,260 | 4/1990 | Suzuki et al. | 174/256 |
| 4,963,697 | 10/1990 | Peterson et al. | 361/414 |

Primary Examiner—Neil Abrams
Attorney, Agent, or Firm—Howard G. Massung; Robert A. Walsh

[57] ABSTRACT

A planer contact grid array connector features a selectively ceramic coated metal substrate in combination with ceramic thick film and/or multi-layer thin film circuitry and contacts of various configurations which may be affixed to or incorporated in mating connector halves. Planer contact array connectors of the type described have coaxial connection features, increased power handling capability and improved means for effecting gas-tight contact between mating connector halves. Additionally, the connectors are more reliable, lighter and more rugged than currently available connectors and have the capability of incorporating integral ceramic thick film components such as capacitors and resistors for filtering, impedance control and signal/power conditioning, as the case may be.

2 Claims, 7 Drawing Sheets

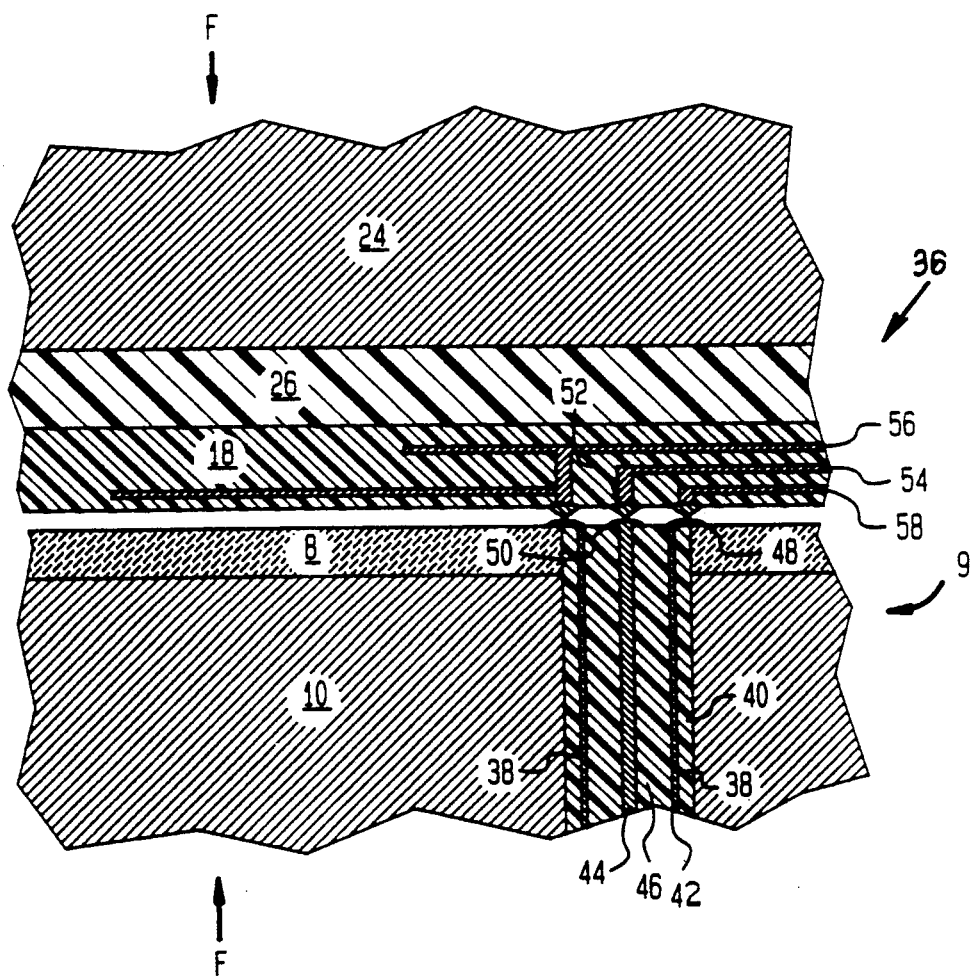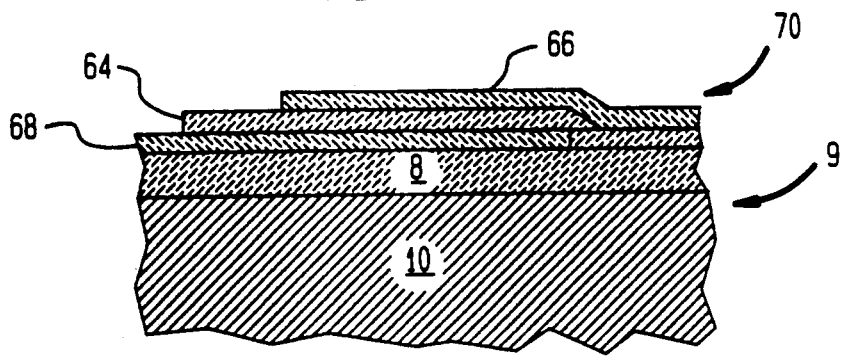

PLANAR CONTACT GRID ARRAY CONNECTOR

BACKGROUND OF THE INVENTION

This invention relates to a planar contact grid array connector having a metal substrate selectively coated with a ceramic, in combination with ceramic thick film and/or multi-layer thin film circuitry and contacts which may be affixed to or incorporated in mating connector halves.

Planar contact grid array connectors of the type described feature the following characteristics: increased power handling capability; improved means for effecting gas-tight contact between mating connector halves; a more rugged, more reliable, lighter and smaller connector than has heretofore been known; coaxial connection features; and integral means for electromagnetic interference (EMI) filtering, impedance control and signal/power conditioning.

Connectors of various types are used to interconnect electrical and electronic devices, assemblies, units, etc. These connectors are available in various geometric configurations, i.e. cylindrical, rectangular, etc., and incorporate various means for electrically connecting and disconnecting circuit paths. Some connector types incorporate integral means for EMI filtering and signal/power conditioning.

The prior art connectors suffer certain disadvantages such as: limited life in terms of connect and disconnect (mate and unmate) cycles; deformation of mating parts; contamination of conducting surfaces; foreign material occluded in connector cavities; large insertion and extraction forces, often beyond manual capabilities; large spacing between adjacent connection points; and the requirement for special repair and inspection tools.

Electromechanical devices, such as relays, have long used contacts which may be electroplated on and/or mechanically affixed to compliant meeting parts, often referred to as contact leads. These contact arrangements generally provide good and long term reliability in terms of gas-tight connections.

Electroplated spherical "gold bumps" have long been applied in grid type patterns to the surfaces of various substrates, i.e. printed circuit boards, ceramic integrated circuit chip carriers, etc. Such arrangements are frequently used for permanently connecting electrical and electronic components via lead wires or beams to circuit paths on or in the substrates.

Compression type interconnect systems or planar contact grid array connectors employ the aforenoted types of contacts and electroplated spherical gold bumps. One such interconnect system is that developed and marketed by the Connecting Devices Division of the Hughes Aircraft Company under the trade designation GOLD DOT. The GOLD DOT connector and a connector marketed by TRW Company, Inc. under the trade designation BUTTON BOARD differ substantially from arrangements employed for other connectors intended for repetitive insertions (matings) and extractions (unmatings).

The compression connector arrangements described above and, in particular, the GOLD DOT arrangement is based on clamping a spherical noble metal contact, which may be an electrically deposited gold bump, on the surface of one mating part against a corresponding noble metal or metal plated pad on the mating component. These dots and pads are precisely arranged in grid type, mirror image patterns on their respective mating components. In use, a minimum of four ounces of clamping force is required for a gas-tight contact or seal. Therefore, a reasonably sized connector with 400 contacts requires a total of 1600 ounces or 100 pounds of force. Small variations in contact surface height must be accommodated and the total force must be borne uniformly by each contact pair. In the instant case, each of the 400 contacts must experience a minimum of 4 ounces of force to assure a gas-tight connection. This requires that one of the mating connector halves be sufficiently rigid to resist deformation induced by the forces concentrated on contact surfaces. The other connector half must have sufficient compliance so that the individual forces are concentrated on the contact surfaces, rather than between said surfaces. Also, this compliance must accommodate small variations in the height of contact surfaces to avoid non-uniform distribution of forces among individual contacts.

In the case of the Hughes GOLD DOT connectors, the mating parts that support the bumps or dots are made of materials usually used for flexible printed circuits. External connection points and conducting paths to the dots are also provided on this flexible substrate material. The corresponding mating part with the pads or bumps may be made of flexible printed circuit board material, rigid or semi-rigid printed circuit board material, or ceramic substrate material. Also, the corresponding part contains the conducting paths between the pad and external connection points.

Unlike most other interconnect systems, the Hughes GOLD DOT or other compression contact connectors do not require large forces during connector engagement and disengagement because the contacts do not "wipe" each other. That is to say, there is no mechanical interference involved. To make reliable, low resistance connections, i.e. gas-tight connections, the two halves of the connector are precisely aligned and a large compression force is applied with a clamping type mechanism. Like several low signal or instrumentation type electric relay contacts, the resulting pressure at each of the dot/pad connection points is usually large enough to break any contaminating film or oxide on either or both surfaces and is sufficient to assure low electrical resistance paths.

Although the Hughes GOLD DOT interconnect arrangement overcomes many of the above noted disadvantages and enables connectors to be more densely populated, i.e. more connection points per unit area, GOLD DOT connectors have several shortcomings. For example, the connection of coaxial conductors is not accommodated and in-line filters, are not accommodated. Further, the capability to handle substantial electrical currents is not available. In addition, the clamping mechanism and related structure needed to withstand deformation and uniformly distribute the required clamping force for the mating connector halves is generally large and heavy. Since at least one mating part is made of flexible material and precise alignment is imperative, more weight and parts are required. Another weight and size penalty is suffered when ceramics, such as alumina, are used in mating parts. These parts must be soldered or bonded to a metal base to survive operating conditions. Also, the obverse side of either of the parts populated with GOLD DOTS, or the mating part with gold pads, cannot be used for mounting components.

SUMMARY OF THE INVENTION

This invention contemplates a planer contact grid array connector wherein a relatively thin layer of ceramic is selectively applied to a metal substrate to provide a selectively ceramic coated metal substrate (SCCMS) suitable for fabrication of thick film hybrid circuits. This is in contrast to conventional ceramic coated metals for electronic applications (usually porcelain enameled steel) to the extent that the SCCMS arrangement is compatible with standard thick film conductive and resistant inks and processing conditions used for alumina substrates, a material of usual choice for hybrid circuit fabrication. The ceramic coating which may be, for example, of silicon nitride, while chemically different from alumina, has comparable or better electrical properties, i.e. dielectric constant and breakdown voltage. Also, when compared to alumina the SCCMS arrangement is extremely strong, as well as highly resistant to oxidation and corrosive environments. These properties allow the SCCMS to be employed in applications which dispense with the usual protective enclosures, and to be physically integrated with mechanical devices functioning in hostile environments.

Because the SCCMS can be processed in the same way as alumina, conventional ceramic-metallic (cermet) thick film conductive and resistant inks can be employed to build up interconnect networks as in conventional hybrid circuit fabrication. Other technologies known in the art can be used to build up additional interconnect structures on top of the SCCMS/thick film circuitry by alternating layers of a polymer dielectric with thin film conductors, including gold bumps and pads, for supplementing thin film processing with electro-deposition where required to build up additional thicknesses of metal for contacts or increased current carrying capacity.

In this regard, reference is made to copending, commonly assigned U.S. application Ser. No. 432,248, now abandoned and U.S. application Ser. No. 319,439 which issued as U.S. Pat. No. 4,999,740 on Mar. 12, 1991 as well as to commonly assigned U.S. application Ser. No. 2,545, (now abandoned).

As earlier indicated, one of the mating connector halves, must have substantial mechanical stiffness to resist deformation and assure uniform distribution of a clamping force over all of the mating contacts. This capability has been previously provided through heavy ancillary reinforcing means that preclude the use of the obverse side of the connector half.

There are other limitations inherent in prior art connector arrangements. These limitations do not allow the connector arrangements to be used for a variety of applications. One such limitation is a low current carrying capacity. The prior art moderately increases current carrying capacity by connecting several contact pairs in parallel. However, the total current capacity is limited by the properties of the materials used in both mating halves of the connector.

The present invention obviates the aforenoted disadvantages of the prior art connector arrangements.

Accordingly, the present invention contemplates a planer contact grid array connector whereby contact current carrying capacity is substantially increased, structural configuration is simplified, and weight and size are reduced. The described selectively coated ceramic metal substrate (SCCMS) and the complementary deposition of multi-layer circuitry on said substrate by a combination of thick and thin film technology, and a high modulus of elasticity selectively ceramic coated metal substrate core material that resists deformation and assures a uniform distribution of force over all of the mating surfaces, are the key elements in overcoming the disadvantages of the prior art. Weight and size reduction are achieved since the SCCMS core material also serves as an integral part of the structure for aligning the two connector halves and for applying the clamping forces. A typical arrangement that may be employed for generating the clamping force includes a cam or eccentrically mounted circular plate (wheel), on either or both sides of the connector (depending on clamping force requirements) actuated by a lever. The clamping force is generated when the cam or eccentric wheel is rotated and the radius is increased. The clamping force is a function of the ratio of the actuating lever length and the eccentric radius.

Structural configuration simplification is achieved since the SCCMS core is an intrinsic part of a connector half and a clamping force is necessary only when engaging connector halves so as to reduce the number of parts. Further, since the metal core is a part of a connector half, alignment of the two halves is simplified. This arrangement reduces the complexity of the structure needed to assure precision alignment of the two halves.

BRIEF DESCRIPTION OF THE DRAWINGS

FIG. 7 is a diagrammatic sectional view of a portion of the connector of FIG. 6.

FIG. 9 is a diagrammatic sectional view of a portion of the connector shown in FIG. 8.

DETAILED DESCRIPTION OF THE INVENTION

Figure 1:
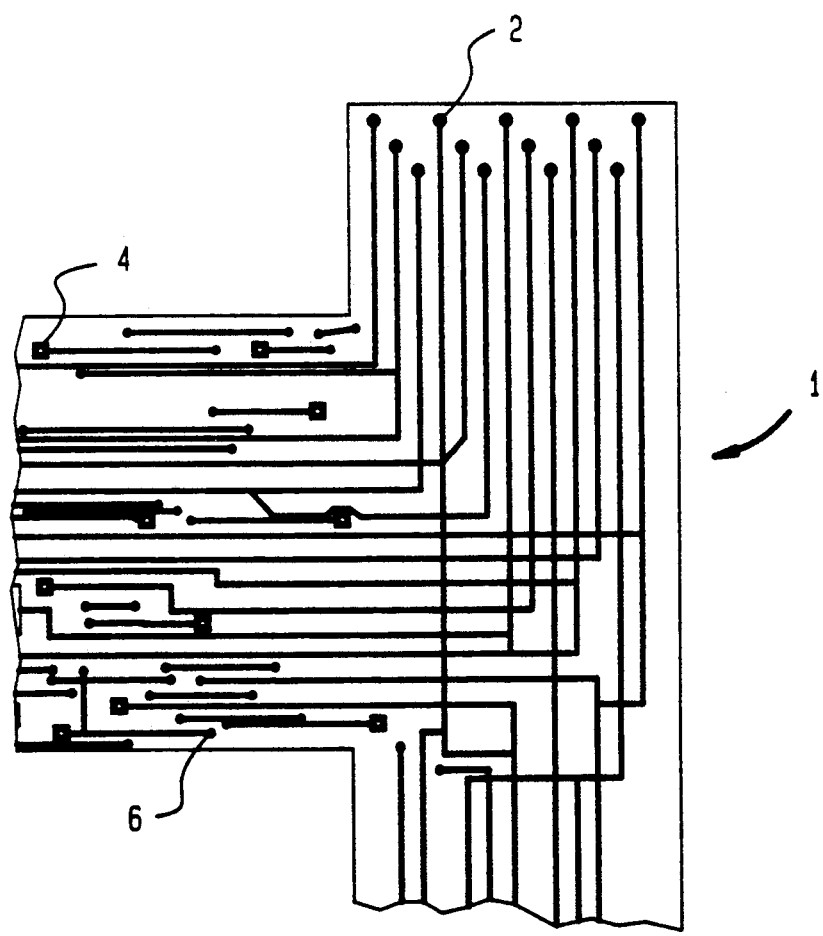
FIG. 1 is a diagrammatic representation of a planar contact grid array connector arrangement having a typical array of simple contacts according to the invention.

With reference to FIG. 1, a planar contact grid array connector arrangement is designated generally by the numeral 1. Arrangement 1 is constructed on a selectively ceramic coated metal substrate (SCCMS) which will hereinafter be more fully described.

Arrangement 1, has a typical grid array of simple contacts 2. Circuitry can be applied to both sides of the SCCMS as will be hereinafter described. Side-to-side interconnecting is accomplished with conductive through holes 4. Holes 4 may be plated through for the purposes intended. Holes 4 will further be referred to with reference to FIG. 3.

Ceramic thick film circuitry is applied directly to the ceramic surface of the SCCMS and multi-layer circuitry based on polymer dielectric and thin film metal conductors can optionally be applied on top of the ceramic thick film circuitry if required, as will also be hereinafter more fully described. Interlayer connection is achieved through vias 6 formed in the polymer dielectric.

The foundation material for the arrangement shown in FIG. 1 is the aforementioned SCCMS in which a ceramic dielectric 8 such as silicon nitride is applied to a metal core 10 (FIGS. 2 and 3) and permanently bonded thereto by firing at a high temperature to form the SCCMS which is designated by the numeral 9.

In regard to SCCMS 9, ceramic dielectric 8 is applied as a coating to metal core 10 as a thick film ink by conventional screen printing methods. Core 10 is a suitable metal having a high modulus of elasticity for the purposes intended. After firing at the aforenoted high temperatures, the resulting ceramic coating, i.e. dielectric 8, resembles alumina. This coating is nonporous, rugged and permanently bonded to the metal on only those areas where the coating was screen printed. The selective nature of the application of the coating allows portions of metal core 10 to be uncoated or left bare. These bare areas provide surfaces or areas for mechanical attaching or otherwise affixing components to SCCMS 9, for electrical connections to metal core 10, or for attaching a SCCMS assembly to external components, other assemblies within a system, or another system, as the case may be.

Figure 2:
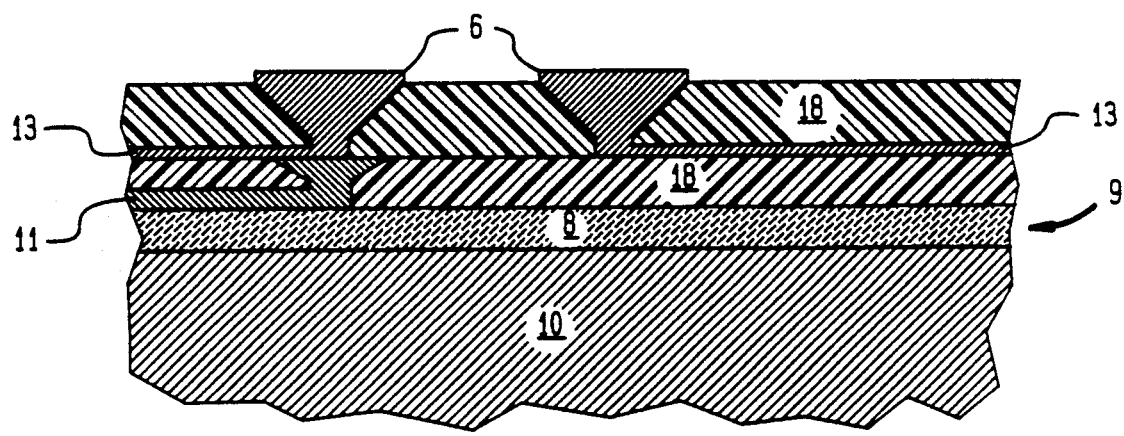
FIGS. 2 and 3 are diagrammatic sectional views of a portion of the connector of FIG. 1, and particularly showing a selectively ceramic coated metal substrate (SCCMS) with through holes and polymer dielectric multilayer circuitry according to the invention.
Figure 3:
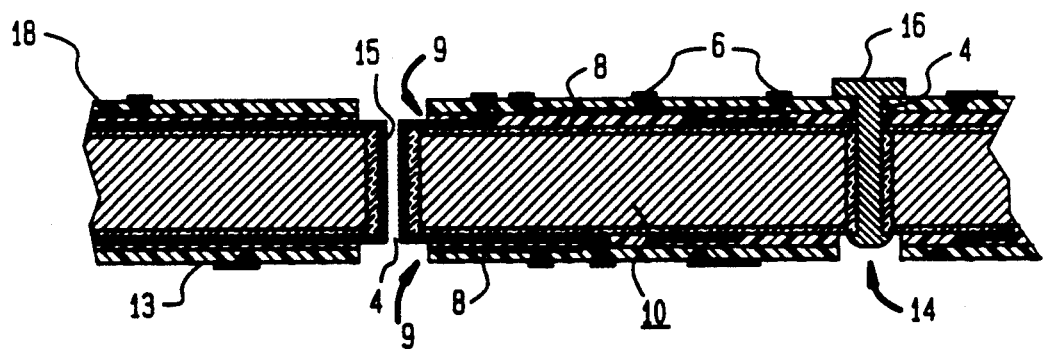

Ceramic dielectric 8 is applied to one or both sides of metal core 10 to provide a single or double sided SCCMS 9. A single sided SCCMS 9 is shown in FIG. 2 and a double sided SCCMS 9 is shown in FIG. 3. Ceramic thick film circuitry is built up on one or both sides of SCCMS 9 by conventional methods employing standard thick film ceramic-metallic (cermet) conductive inks to form thick film conductor traces such as 11. Electrical connection to metal core 10 can be made through openings formed in the ceramic dielectric for that purpose.

Interconnection between circuitry on opposite sides of SCCMS 9 is achieved by conductive through holes 4. Holes 4 are lined with an insulating layer of a suitable polymer 15 and are metallized by conventional electroless or electrolytic plating of copper such as employed in the manufacture of multilayer printed circuit boards. Holes 4 can be located in areas where ceramic dielectric 8 is continuous so as to connect a copper (for example) thin film conductor 13 on one side (FIG. 3) to a thick film conductor 11 (FIG. 2) on the opposite side of holes 4, as will now be discerned.

Alternatively, holes 4 can be located in an area where ceramic dielectric 8 is absent so that no side-to-side circuit connection is made. In this case, through holes 4 accommodate contacts such as 16 that have substantially greater current carrying capacity. Contacts 16, which are of a noble metal, are affixed via riveting, as shown in FIG. 3, or by having the shank end of the contact threaded for a nut to secure the contact to the SCCMS structure (not otherwise shown). The shank end of the contact also provides means for connecting large current carrying leads. Also, male/female contacts may be used when required and the means for incorporation of said male/female contacts into the assembly is the same as described above for contact 16.

Multi-layer circuitry employing polymer dielectric layers 18 and thick film conductors 11 can be built up on top of SCCMS 9 thick film circuitry by successive applications of the polymer dielectric followed by vacuum deposition and patterned thin film metallization to form conductors and pads or contacts. Vias 6 which interconnect layers of thin film circuitry are formed in the polymer dielectric layers by a film imaging process followed by metallization.

Figure 5:
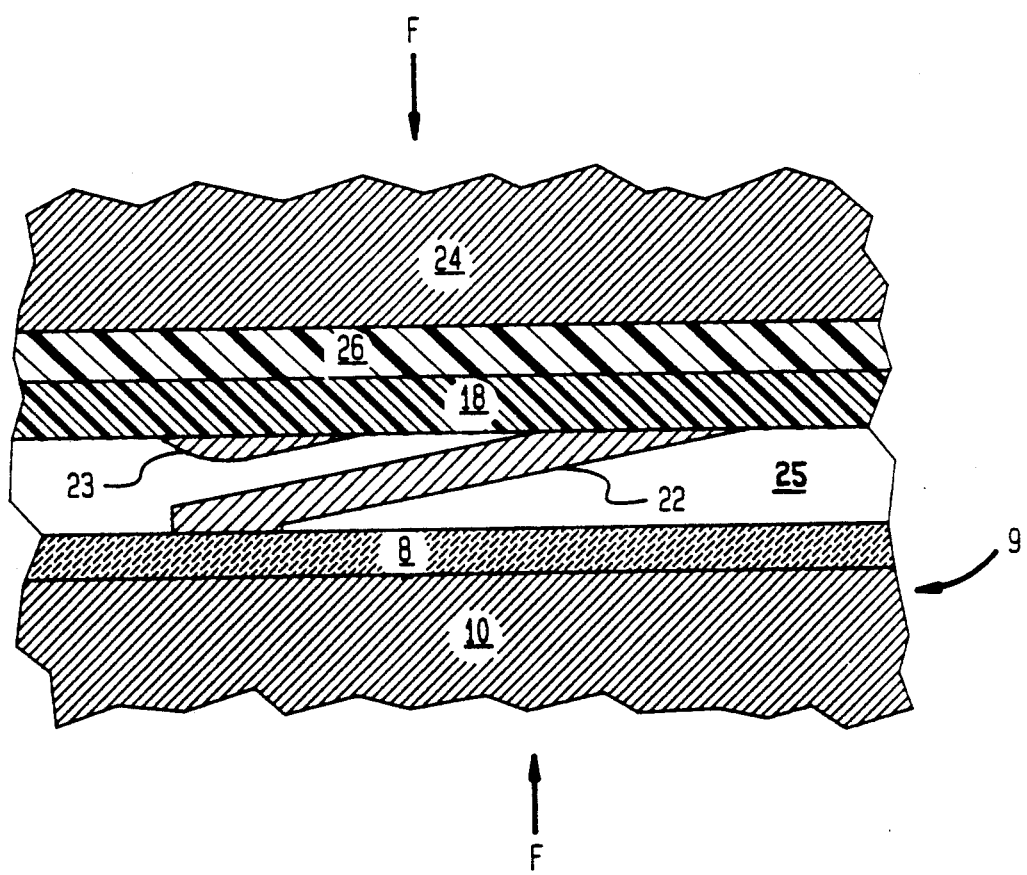
FIG. 5 is a diagrammatic sectional view of a bar-type contact connector according to the invention.

An alternate arrangement for increasing current carrying capacity is shown in FIG. 5. In this arrangement noble metal (e.g., gold) bars are used instead of an array of dots and provide a greater capacity and allow a current plane to carry current instead of several conducting paths for that purpose.

The arrangement includes a thick film gold contact bar 22 disposed in a space 25 between SCCMS 9 including metal core 10 and ceramic dielectric 18 and a polymer dielectric layer 8, and a plated gold contact bar 23 disposed within polymer dielectric layer 18. A metal backing plate 24 is supported by a layer 26 of elastomer or the like. A clamping force F is applied to metal core 10 of SCCMS 9 and to backing plate 24. Force F is applied through the aforementioned cam and eccentrically mounted plate (not shown).

Figure 4:
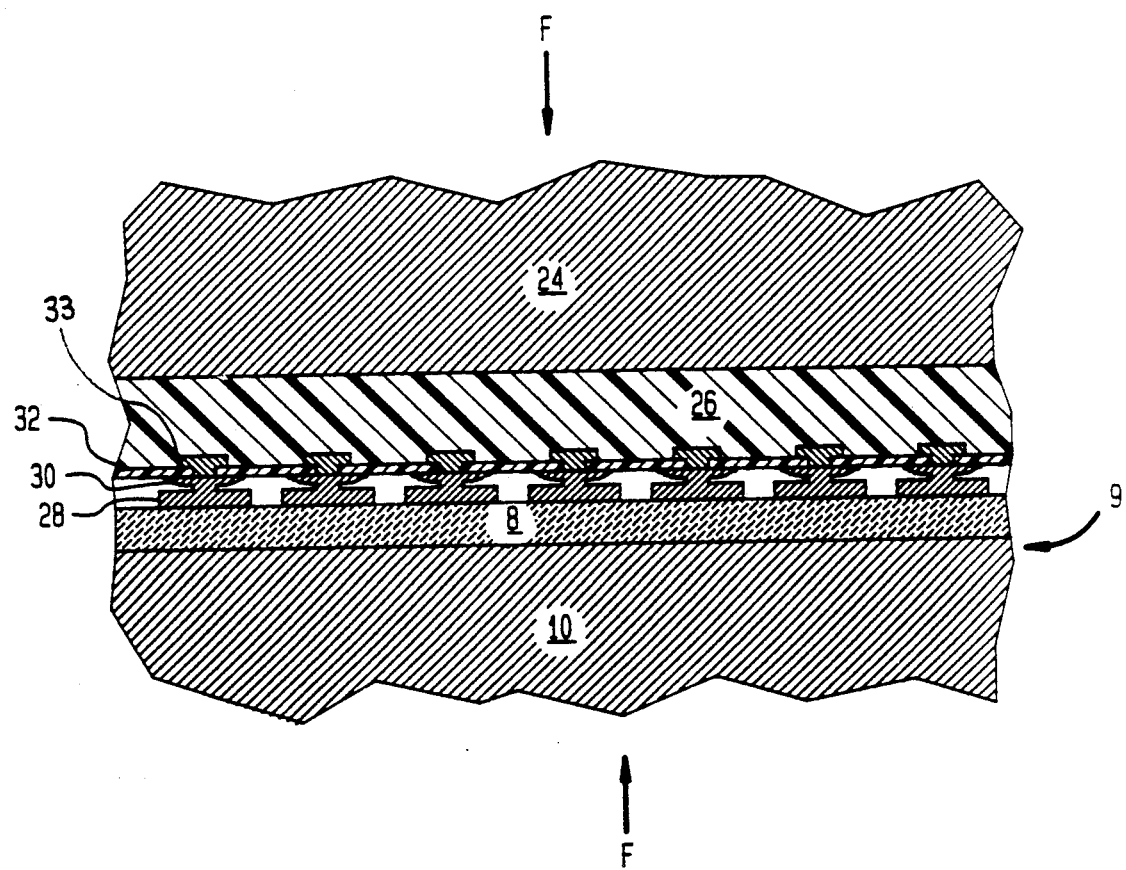
FIG. 4 is a diagrammatic sectional view illustrating the construction of a simple planer contact grid array connector according to the invention.

FIG. 4 illustrates the construction of planer contact grid array connector regions on SCCMS 9. A simple contact grid array connector is fabricated from an array of thick film gold contact pads and conductors 28 formed on SCCMS 9 by conventional methods, thus providing one half of a connector pair. In contrast to alumina, the SCCMS structure is extremely strong and can readily tolerate the high clamping forces F required for gas-tight contacts without significant deformation.

The mating half of the connector shown in FIG. 4 can be of a conventional flexible or semi-rigid single or multiple layer printed circuit board material, with electroplated gold contacts or bumps 30 on one side of a flexible polymer film 32. Bumps 30 are connected to copper conductors 33 on the opposite side of the flexible film. Behind the flexible film, is a layer of compliant elastomer 26 which serves to distribute force F applied by metal backing plate 24 uniformly over the individual contacts. Elastomer layer 26 thus serves the same purpose as it does in the arrangement shown in FIG. 5. Using usual manufacturing techniques, the higher current carrying capacity contacts may be riveted or otherwise mechanically attached to this half of the connector as will now be readily discerned.

Figure 6:
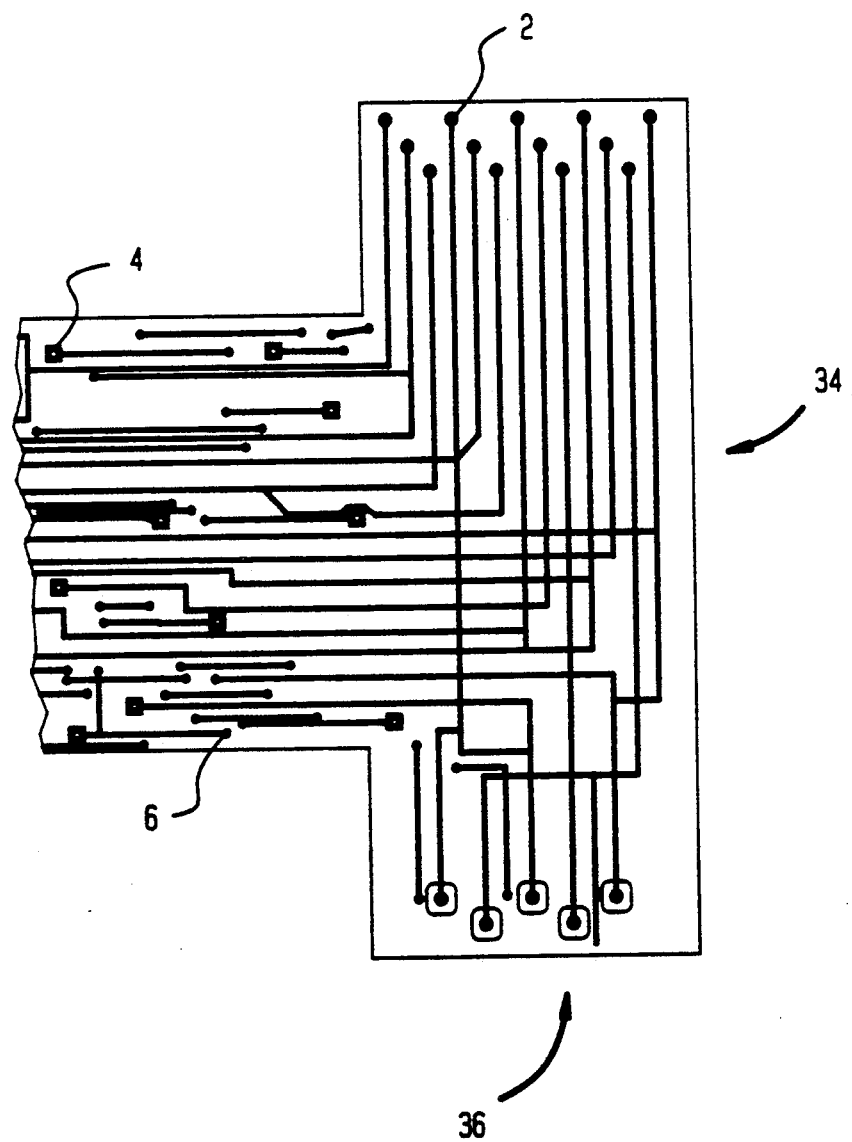
FIG. 6 is a diagrammatic representation of a planar contact grid array connector arrangement having a typical array of simple contacts and coaxial contacts according to the invention.

FIG. 6 illustrates a planer grid array connector arrangement designated generally by the numeral 34. Connector arrangement 34 is similar to connector arrangement 1, except that a coaxial contact grid array 36 is provided. Otherwise the construction of the arrangement on SCCMS 9 is as heretofore described with reference to FIGS. 2-5.

FIG. 7 more particularly illustrates coaxial contact grid array 36 on connector arrangement 34.

Thus, through holes 38 are formed in SCCMS 9 at locations where coaxial connections are required. These through holes are connected to circuitry on the SCCMS side of the assembly, opposite the connector region (the obverse side).

Through holes 38 are insulated from metal core 10 by a layer of polymer dielectric 40. A shield 42 is formed by electroless or electrolytic metallization of the polymer dielectric as aforementioned. That is to say, the metallization method is the same as conventionally employed for plated through holes in printed circuit boards.

The center conductor of a coaxial connection is formed by a wire insert 44 which is insulated from the through hole metallization by a polymer dielectric 46 filling the resulting annular space. At the surface, flush with ceramic dielectric 8, an annular pad 48 and a center pad 50 are formed by thin film deposition of metal. Where necessary, electrolytic plating is used to build up the contact or pad to the required thickness.

These pads mate with corresponding pads 52 on the surface of polymer dielectric 23 on the mating half of the connector pair. The center conductor pad 50 is connected to a signal line 54 and annular pad 48 is connected to both shield layers 56 and 58 within the multi-layer interconnect structure. This structure is an integral part of half of the connector pair as heretofore noted.

Forces F are applied as heretofore described with reference to FIG. 4.

Figure 8:
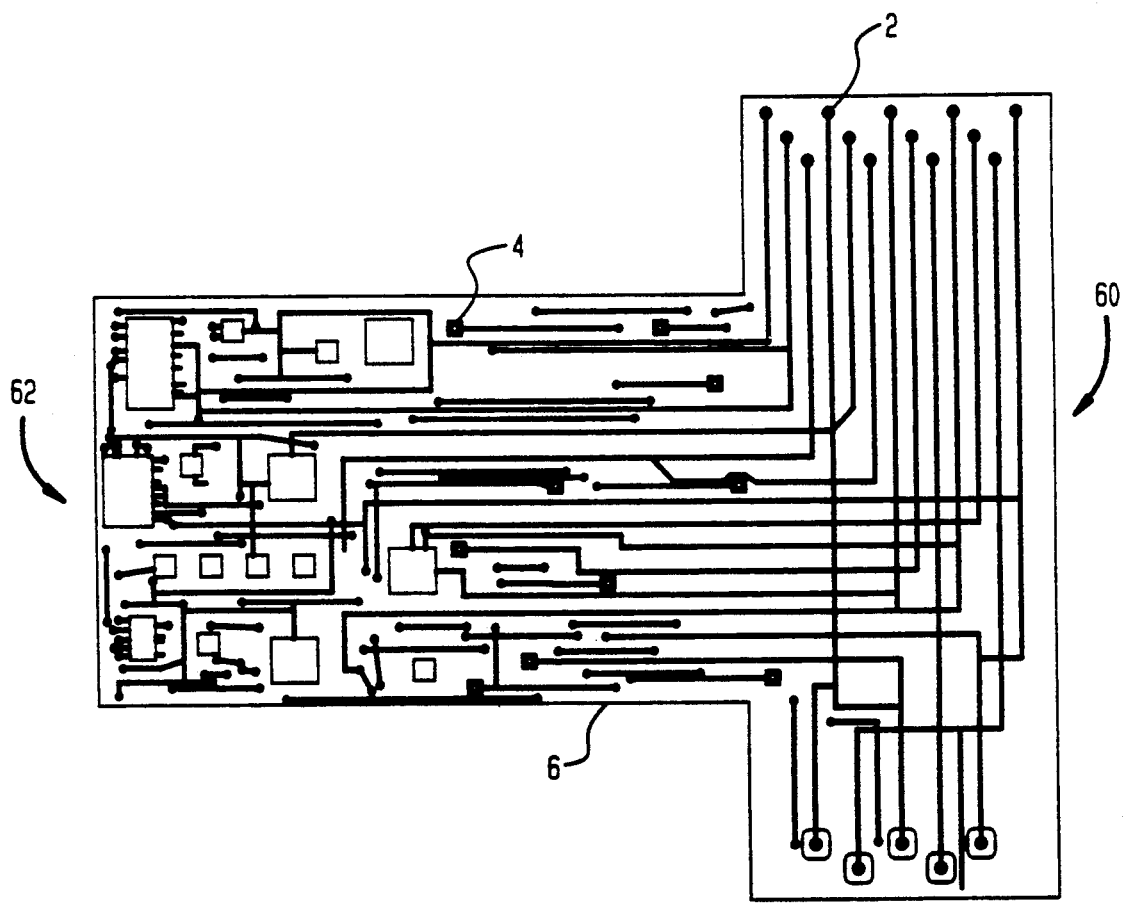
FIG. 8 is a diagrammatic representation of a planer contact grid array connector arrangement having a typical array of simple contacts, coaxial contacts and active circuitry according to the invention.

FIG. 8 illustrates a planer grid array connector arrangement designated generally by the numeral 60. Arrangement 60 is similar to arrangement 34 shown in FIG. 6, except that ceramic thick film active circuitry 62 is incorporated into the arrangement. The arrangement is constructed in accordance with FIGS. 2-5 as heretofore described.

With reference to FIG. 9, ceramic thick film components such as capacitors are incorporated into circuitry 62 on SCCMS 9 by printing a high dielectric constant thick film ceramic layer 64 such as, for example, barium titanate between two thick film ceramic conductor layers 66 and 68. Conductor layers 66 and 68 form a capacitor 70 integral with SCCMS 9 and part of circuitry 62.

The capacitor or capacitors 70, or other such components such as resistors, thus formed can be used for electromagnetic interference (EMI) control, conditioning of signals and power, and for other functions as part of active circuitry 62, as will now be discerned.

There has thus been described planer contact grid array connectors featuring selectively ceramic coated metal substrate (SCCMS) technology in combination with ceramic thick film and/or multi-layer thin film circuitry and contacts which may be electroplated on and/or otherwise affixed to or incorporated in mating conductor halves. These planer contact array connectors provide coaxial connection features, increased power handling capability, and improved means for effecting gas-tight contact between mating connector halves. Additionally, integral ceramic thick film components, such as capacitors and resistors for filtering, impedance control and signal/power conditioning may be included in the connector structure. The connectors are more rugged, lighter, smaller and more reliable than other planer contact array connectors now known in the art.

With the above description of the invention in mind, reference is made to the claims appended hereto for a definition of the scope of the invention.

What is claimed is:

1. A planar contact grid array connector, comprising:
   a metal core;
   a ceramic dielectric coating selectively disposed on at least one side of the metal core so that portions of the at least one side of the metal core do not have the ceramic dielectric coating thereon, with said metal core and ceramic dielectric coating disposed thereon providing a substrate;
   circuitry provided on the ceramic dielectric coating, with said circuitry and substrate providing one half of a connector pair, said circuitry including ceramic thick film circuit means disposed on top of the ceramic dielectric coating, and polymer dielectric means with thick film metal conductor means disposed on top of the ceramic thick film circuit means and including a plurality of layers and means provided in the polymer dielectric means for interconnecting said plurality of layers;
   conductive through holes provided in the substrate at locations where coaxial connections are required;
   polymer dielectric means for insulating the coaxial connection conductive through holes from the metal core;
   center conductors of coaxial connections extending through the substrate;
   polymer dielectric means for insulating the center conductors from the conductive through holes;
   annular pads on the surface of the ceramic dielectric coating connected to the conductive through holes;
   center pads on the surface of the ceramic dielectric coating connected to the center conductors;
   mating circuitry disposed over the circuitry provided on the ceramic dielectric coating;
   a compliant member disposed over the mating circuitry, with said compliant member and mating circuitry forming the other half of the connector pair;
   a backing plate disposed over the compliant member; and
   a clamping force applied to the metal core of the substrate and to the backing plate for engaging and aligning the one and the other halves of the connector pair, with the compliant member ensuring a uniform distribution of the clamping force over the mating circuitry.

2. A connector as described by claim 1, wherein the mating circuitry includes:
   polymer dielectric means;
   pads on the surface of the polymer dielectric means corresponding to and mating with corresponding annular and center pads on the surface of the ceramic dielectric coating; and
   the outer pads on the surface of the ceramic dielectric coating being thereby connected to a conductor within the polymer dielectric means, and the annular pads on said ceramic dielectric coating surface being connected to shield layers within the polymer dielectric means.

* * * * *